(12) United States Patent
Yang et al.

(10) Patent No.: US 12,224,213 B2
(45) Date of Patent: Feb. 11, 2025

(54) HIGH VOLTAGE DEVICE

(71) Applicant: Taiwan Semiconductor Manufacturing Co., Ltd., Hsin-Chu (TW)

(72) Inventors: Sung-Hsin Yang, Hsinchu (TW); Jung-Chi Jeng, Tainan (TW); Ru-Shang Hsiao, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 20 days.

(21) Appl. No.: 17/008,251

(22) Filed: Aug. 31, 2020

(65) Prior Publication Data

US 2022/0068721 A1    Mar. 3, 2022

(51) Int. Cl.
| | |
|---|---|
| *H01L 21/8234* | (2006.01) |
| *H01L 21/027* | (2006.01) |
| *H01L 21/308* | (2006.01) |
| *H01L 21/311* | (2006.01) |
| *H01L 27/088* | (2006.01) |

(Continued)

(52) U.S. Cl.
CPC .. *H01L 21/823481* (2013.01); *H01L 21/0274* (2013.01); *H01L 21/31144* (2013.01); *H01L 21/823431* (2013.01); *H01L 21/823456* (2013.01); *H01L 27/0886* (2013.01); *H01L 29/0649* (2013.01); *H01L 29/66545* (2013.01);

(Continued)

(58) Field of Classification Search
CPC ..... H01L 21/823431; H01L 21/823456; H01L 21/823481; H01L 21/3081; H01L 21/3086; H01L 21/76224; H01L 21/823821; H01L 21/823878; H01L 27/0886; H01L 21/0924; H01L 29/41791; H01L 29/66795; H01L 29/785; H01L 29/66545; H01L 27/0924
See application file for complete search history.

(56) References Cited

U.S. PATENT DOCUMENTS

| | | | | |
|---|---|---|---|---|
| 7,141,456 | B2 * | 11/2006 | Lee | H01L 29/7851 |
| | | | | 438/151 |
| 7,535,061 | B2 * | 5/2009 | Lee | H01L 29/7851 |
| | | | | 257/353 |

(Continued)

FOREIGN PATENT DOCUMENTS

TW    I1603451 B    10/2017

*Primary Examiner* — Mary A Wilczewski
(74) *Attorney, Agent, or Firm* — HAYNES AND BOONE, LLP

(57) ABSTRACT

Semiconductor devices and methods are provided. A semiconductor device according to the present disclosure includes a substrate having a first area and a second area, a plurality of fin structures extending along a direction over the first area and the second area of the substrate, a first transistor and a second transistor in the first area, a first isolation structure disposed between the first transistor and the second transistor, a first isolation structure disposed between the first transistor and the second transistor, a third transistor and a fourth transistor in the second area, and a second isolation structure disposed between the third transistor and the fourth transistor. The first isolation structure includes a first width along the direction and the second isolation structure includes a second width along the direction. The second width is greater than the first width.

20 Claims, 11 Drawing Sheets

(51) Int. Cl.
*H01L 29/06* (2006.01)
*H01L 29/66* (2006.01)
*H03M 1/06* (2006.01)

(52) U.S. Cl.
CPC ......... *H03M 1/068* (2013.01); *H01L 21/3081* (2013.01); *H01L 21/3086* (2013.01)

(56) References Cited

U.S. PATENT DOCUMENTS

| | | | |
|---|---|---|---|
| 9,673,330 B2 * | 6/2017 | Chung | H01L 29/1033 |
| 9,728,407 B2 | 7/2017 | Hsieh et al. | |
| 9,899,267 B1 * | 2/2018 | Liou | H01L 21/823481 |
| 10,074,572 B2 * | 9/2018 | Chung | H01L 21/8232 |
| 2004/0262676 A1 * | 12/2004 | Lee | H01L 29/66795 |
| | | | 257/328 |
| 2007/0034925 A1 * | 2/2007 | Lee | H01L 29/66795 |
| | | | 257/296 |
| 2015/0097251 A1 | 4/2015 | Kwon | |
| 2016/0336315 A1 | 11/2016 | You | |
| 2017/0316984 A1 * | 11/2017 | Lin | H01L 21/823437 |
| 2020/0343359 A1 | 10/2020 | Liaw | |
| 2021/0335674 A1 * | 10/2021 | Lin | H01L 29/785 |
| 2021/0408263 A1 * | 12/2021 | Lin | H01L 29/0649 |
| 2022/0037196 A1 * | 2/2022 | Ku | H01L 21/823431 |
| 2022/0068120 A1 * | 3/2022 | Alfano | G08G 1/093 |
| 2022/0068721 A1 * | 3/2022 | Yang | H01L 21/823456 |

\* cited by examiner

HIGH VOLTAGE DEVICE

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, such scaling down has also been accompanied by increased complexity in design and manufacturing of devices incorporating these ICs, and, for these advances to be realized, similar developments in device fabrication are needed.

Development of high voltage devices, such as input/output (I/O) devices or analog-to-digital converters (ADCs), does not always track that of the core devices, such as logic devices or memory devices. For example, many high voltage devices remain planar devices while core devices have widely been implemented as multi-gate devices, such as fin-type field effect transistors (FinFETs) or gate-all-around (GAA) transistors. Replacing planar high voltage devices with multi-gate counterparts may not be intuitive. For instance, isolation structures among multi-gate high voltage devices may be needed to reliably form source/drain recesses and epitaxially grow source/drain features in the source/drain recesses. Because isolation structures may take up space, direct replacement of planar high voltage devices with multi-gate high voltage devices of comparable dimensions may not be appropriate. In addition, compared to core devices, high voltage devices have different feature sizes and insulation requirements due to their higher operating voltages. When core devices and high voltage devices are fabricated on the same workpiece or over the same fin structures, these different feature sizes may not be amenable to being formed in the same processes. Therefore, although existing high voltage devices and processes of forming the same are generally adequate for their intended purposes, they may not be satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
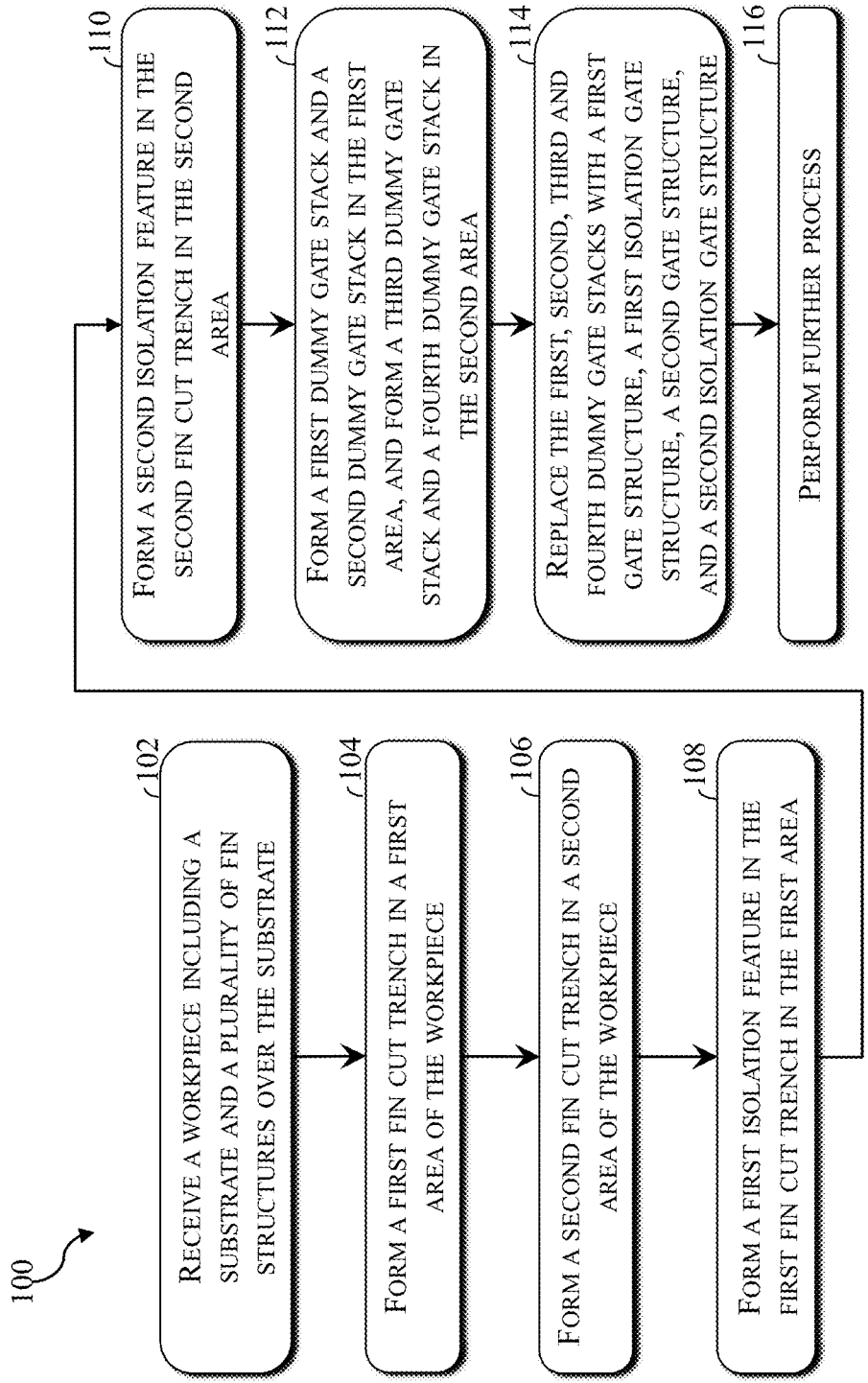
FIG. 1 is a flowchart of a method of fabricating a semiconductor device, according to various aspects of the present disclosure.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed interposing the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc., as well as derivatives thereof (e.g., "horizontally," "downwardly," "upwardly," etc.) are used for ease of the present disclosure of one features relationship to another feature. The spatially relative terms are intended to cover different orientations of the device including the features.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

Besides input/output (I/O) devices that interface between core devices and external circuitry, high voltage devices are also used in analog-to-digital converters (ADCs). For example, in the majority of CMOS image sensors, high performance ADCs are employed to convert amplified analog signals from a CMOS pixel array to digital output for further digital imaging processing. Fabrication of ADCs for a CMOS image sensor has its fair share of challenges, such as noise, gain errors and offset errors. During field application in a transistor, charge carriers (electrons or holes) travelling in the channel between a source and a drain are affected as the charge carriers get trapped and de-trapped at the interfaces with gate dielectric layers. When the gate dielectric layers have more defects, the trapping and de-trapping of charge carriers become more pronounced, resulting in fluctuation in carrier mobility. The fluctuation in carrier mobility tends to generate or increase electronic noises, such as flicker noise and random telegraph signal (RTS) noise. Flicker noise (sometimes called 1/f noise or pink noise) is a low frequency noise that may exhibit an inverse frequency power density curve. RTS noise (sometimes called burst noise, popcorn noise, impulse noise, bi-stable noise) may cause sudden changes in channel current at random and unpredictable times. Although certain measures such as thinning down the gate dielectric thickness may reduce noises, a thinner gate dielectric layer may degrade performance of a transistor, for example, in high-voltage applications. Moreover, when an ADC includes an array of high voltage transistors, these high voltage transistors may not have uniform threshold voltages. While this threshold voltage mismatch within the array is acceptable in digital applications, it may introduce gain and offset errors in the ADC's transfer function. These errors may lead to fixed-patterned noise which can be difficult to rectify.

One of the solutions to reduce noises and errors in an ADC is to increase the gate length of the transistors in the ADC. It has been observed that when the gate length (measured along the lengthwise direction of the active regions, such as fin structures) is increased to between about 0.24 µm (240 nm) and about 6 µm (6000 nm), both the noises and the errors may be greatly reduced. Considering the undesirability of large dimensions, the gate length may be between 0.24 µm (240 nm) and about 1.8 µm (1800 nm) for a balanced performance of noise/error reduction and device dimensions. Conventionally, the transistors in an ADC are planar devices where a gate structure is disposed along one surface of an active region. Because planar devices and multi-gate devices are fabricated using different processes, fabricating planar devices and multi-gate devices on the same substrate may be complicated and costly. To improve device performance and to streamline fabrication processes, planar high voltage devices may be replaced with multi-gate counterparts. To reliably form source/drain recesses and epitaxially grow source/drain features in the source/drain recesses, isolation structures among multi-gate high voltage devices may be needed. Because isolation structures may take up space, direct replacement of planar high voltage devices with multi-gate high voltage devices of comparable dimensions may not be appropriate. In addition, compared to core devices, high voltage devices have different feature sizes and insulation requirements due to their higher operating voltages. Even when similar fabrication processes are used to form high voltage devices and core devices on the same workpiece, the difference in dimensions may create complications. For example, process loading effect may be significant between a core device area and a high voltage device area on a workpiece.

The present disclosure provides high voltage devices and methods of forming the same. A high voltage device of the present disclosure includes FinFETs that are isolated by isolation structures that include an isolation gate structure on a dielectric material disposed within a fin cut trench. In some instances, an isolation structure of the present disclosure may be referred to as a continuous polysilicon on oxide definition (CPODE). The formation of a CPODE includes forming a fin cut trench through multiple fins, depositing a dielectric material in the fin cut trench, and forming an isolation gate structure over the filled fin cut trench. In embodiments of the present disclosure, both core devices and high voltage devices are formed on the same workpiece that includes a plurality of fin structures extending through boundaries between core device areas and high voltage device areas. Methods of the present disclosure form different fin cut trenches using different processes in different device areas. For example, methods of the present disclosure form first fin cut trenches in the core device area using a first lithographic process and second fin cut trenches in the high voltage device area using a second lithographic process. In some instances, the first and second lithographic process may include different radiation sources and use of different photoresist layers.

The various aspects of the present disclosure will now be described in more detail with reference to the figures. FIG. 1 illustrates a flowchart of a method 100 of forming a semiconductor device on a workpiece 200 (not shown in FIG. 1 but shown in FIGS. 2-11). Method 100 is merely an example and not intended to limit the present disclosure beyond what is explicitly recited in the claims. Additional operations can be provided before, during, and after method 100, and some operations described can be replaced, eliminated, or moved around for additional embodiments of the method. Method 100 is described below in conjunction with FIGS. 2-10, each of which illustrate a fragmentary cross-sectional view or a top view of the workpiece 200 during various operations of method 100. The workpiece 200 may be an intermediate device fabricated during processing of an IC, or a portion thereof, that may comprise static random-access memory (SRAM) and/or other logic circuits, passive components such as resistors, capacitors, and inductors, and active components such as p-type FETs (PFETs), n-type FETs (NFETs), FinFETs, metal-oxide semiconductor field effect transistors (MOSFET), complementary metal-oxide semiconductor (CMOS) transistors, bipolar transistors, high voltage transistors, high frequency transistors, and/or other memory cells. The present disclosure is not limited to any particular number of devices or device regions, or to any particular device configurations. Additional features can be added in semiconductor devices fabricated on the workpiece 200, and some of the features described below can be replaced, modified, or eliminated in other embodiments of the semiconductor device to be fabricated on the workpiece 200. Because a semiconductor device is to be formed from the workpiece 200 at the conclusion of the processes described in the present disclosure, the workpiece 200 may be referred to as a semiconductor device 200 as the context requires.

Figure 2:
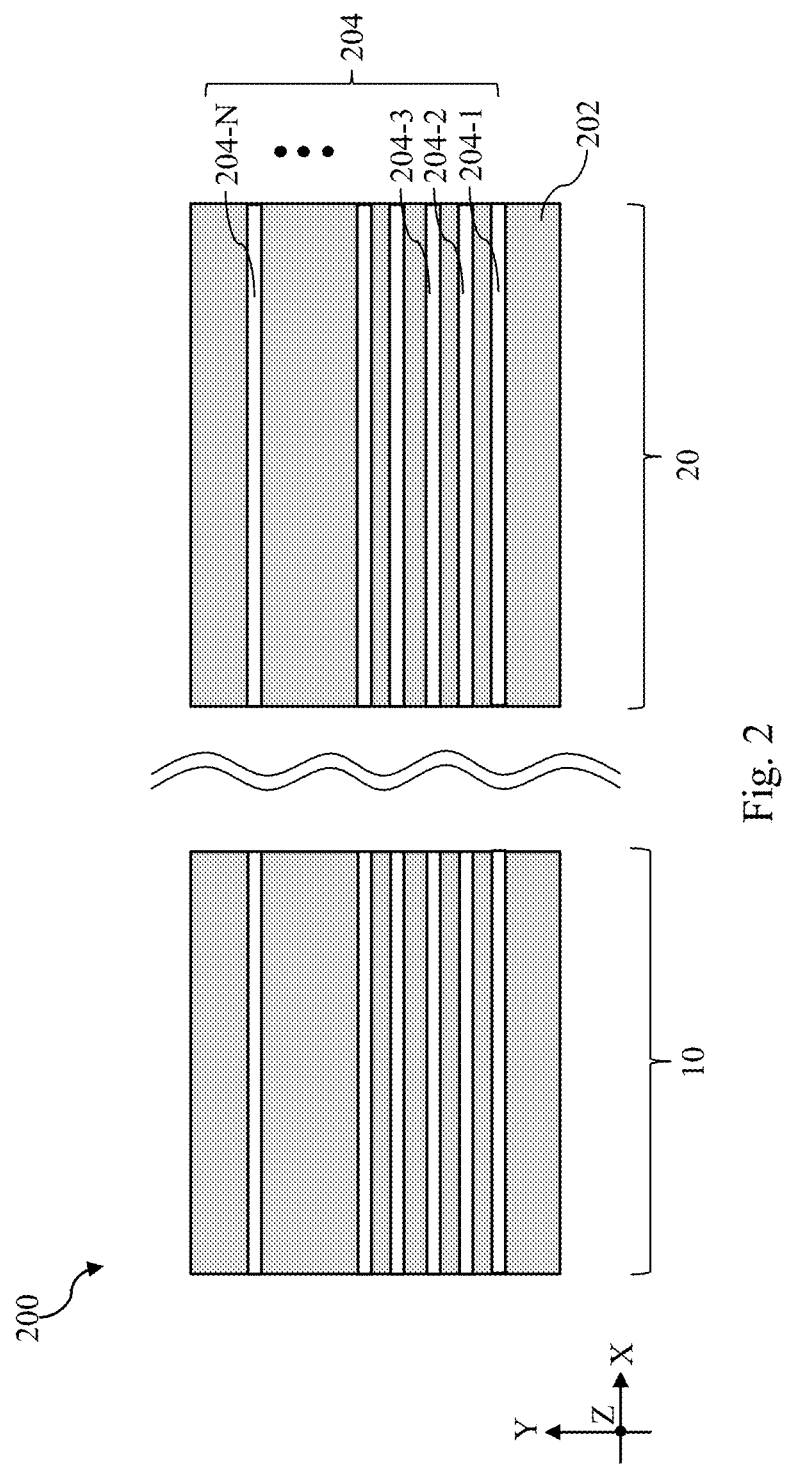
FIGS. 2-6 and 8 are fragmentary top views of a workpiece undergoing various operations of the method in FIG. 1, according to various aspects of the present disclosure.

Referring to FIGS. 1 and 2, method 100 includes a block 102 where a workpiece 200 is received. The workpiece 200 includes a substrate 202 and a plurality of fin structures 204 (including 204-1 to 204-N) over the substrate 202. As shown in FIG. 2, the substrate 202 includes a first area 10 and a second area 20 and the plurality of fin structures 204 extend over the first area 10 and the second area 20. In some embodiments, the first area 10 may be a core device area that includes logic devices, memory devices, or digital signal processing devices and the second area 20 may be a high voltage device area, an ADC device area, or an I/O device area. In some implementations, devices in the first area 10 operate and are configured to operate at an operating voltage between about 0.5 V and about 1 V and devices in the second area 20 operate and are configured to operate at an operating voltage between about 2.5 V and 4V. The plurality of fin structures 204 may include fin structures 204-1 to 204-N, where N may be between 2 and 80. As shown in FIG. 2, the plurality of fin structures 204 may be parallel to one another. Each of the plurality of fin structure 204 is connected to arising from the substrate 202. Additionally, each of the plurality of fin structures 204 may be referred to as an active region or a fin-shaped active region. In some embodiments where the semiconductor device 200 is an ADC, the first area 10 is a digital area for low voltage digital signal processing operation and the second area 20 is an analog area for high voltage operations.

The substrate 202 may include an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor, such as SiGe, GaAsP, AlInAs, AlGaAs, GaInAs, GaInP, GaInAsP, and/or other suitable materials. The substrate 202 may be a single-layer material having a uniform composition. Alternatively, the substrate 202 may include multiple material layers having similar or different compositions suitable for IC device manufacturing. In one example, the substrate 202 may be a silicon-on-insulator (SOI) substrate having a silicon layer formed on a silicon oxide layer. In another example, the substrate 202 may include a conductive layer, a semiconductor layer, a dielectric layer, other layers, or combinations thereof. In some embodiments where the substrate 202 includes FETs, various doped regions, such as source/drain regions, are disposed in or on the substrate 202. The doped regions may be doped with p-type dopants, such as phosphorus or arsenic, and/or n-type dopants, such as boron or $BF_2$, depending on design requirements. The doped regions may be formed directly on the substrate 202, in a p-well structure, in an n-well structure, in a dual-well structure, or using a raised structure. Doped regions may be formed by implantation of dopant atoms, in-situ doped epitaxial growth, and/or other suitable techniques.

The plurality of fin structures 204 may be fabricated using suitable processes including photolithography and etch processes. The photolithography process may include forming a photoresist layer (resist) overlying the substrate 202, exposing the resist to a pattern, performing post-exposure bake processes, and developing the resist to form a masking element (not shown) including the resist. The masking element is then used for etching recesses into the substrate 202, leaving the plurality of fin structures 204 on the substrate 202. The etching process may include dry etching, wet etching, reactive ion etching (RIE), and/or other suitable processes. Numerous other embodiments of methods for forming the plurality of fin structures 204 may be suitable. For example, the plurality of fin structures 204 may be patterned using double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the plurality of fin structures 204.

While not explicitly shown in FIG. 2, the plurality of fin structures 204 may be separated from one another by an isolation feature that may include silicon oxide, silicon nitride, silicon oxynitride, fluoride-doped silicate glass (FSG), a low-k dielectric material, and/or other suitable materials. The isolation feature may include shallow trench isolation (STI) features. In one embodiment, the isolation feature may be formed by etching trenches in the substrate 202 during the formation of the plurality of fin structures 204. The trenches may then be filled with an isolating material described above by a deposition process, followed by a chemical mechanical planarization (CMP) process. Other isolation structure such as field oxide, local oxidation of silicon (LOCOS), and/or other suitable structures may also be implemented as the isolation feature. Alternatively, the isolation feature may include a multi-layer structure, for example, having one or more thermal oxide liner layers. The isolation feature may be deposited by any suitable method, such as chemical vapor deposition (CVD), flowable CVD (FCVD), spin-on-glass (SOG), other suitable methods, or combinations thereof.

Figure 3:
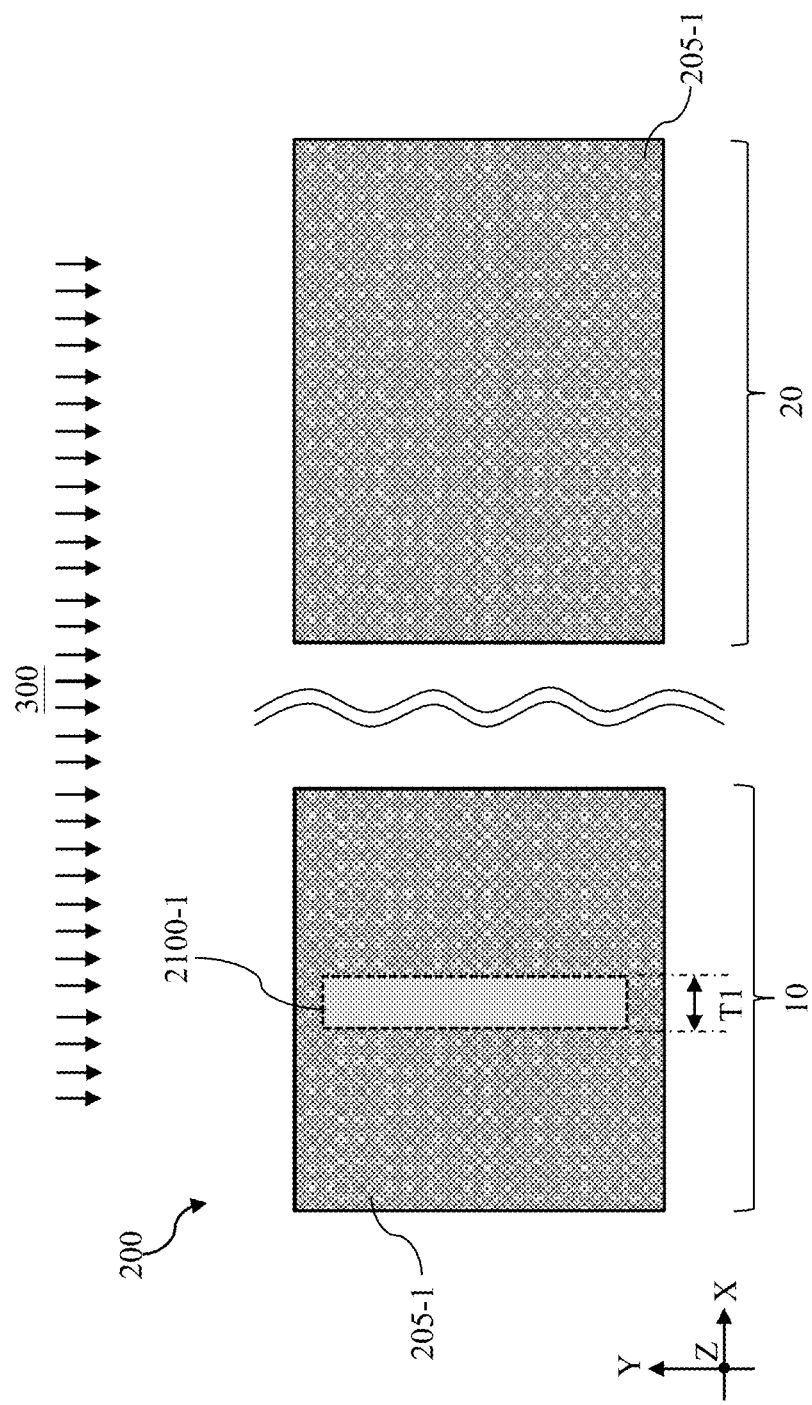

Referring to FIGS. 1 and 3, method 100 includes a block 104 where a first fin cut trench 2100-1 in the first area 10 of the workpiece 200 is formed. To provide a planar surface for the operations at block 104, a first photoresist layer 205-1 is deposited over the workpiece 200, including over the plurality of fin structures 204. In these embodiments, the first photoresist layer 205-1 is polymeric and may be deposited using spin-on coating. The first photoresist layer 205-1 may then be patterned using a first lithography process 300 to form a first photoresist pattern. In some implementations, the first lithography process 300 may include a first radiation source (not explicitly shown), such as an argon fluoride excimer laser radiation source (ArF, wavelength about 193 nm), and may include use of immersion lithography. In these implementations, the first photoresist layer 205-1 is selected such that it is suitable for use with the first lithography process 300 and the first radiation source. The patterned first photoresist layer 205-1 (i.e., first photoresist pattern) includes an opening that exposes the plurality of fin structures 204 in the first area 10. An anisotropic etch process may then be implemented to form the first fin cut trench 2100-1 in the first photoresist layer 205-1 and through the plurality of fin structures 204. In some instances, the first fin cut trench 2100-1 includes a first trench width (T1) that is between about 10 nm and about 35 nm. In some embodiments, after the first fin cut trench 2100-1 is formed in the first area 10, the first photoresist layer 205-1 may be removed, for example, by ashing.

Figure 4:
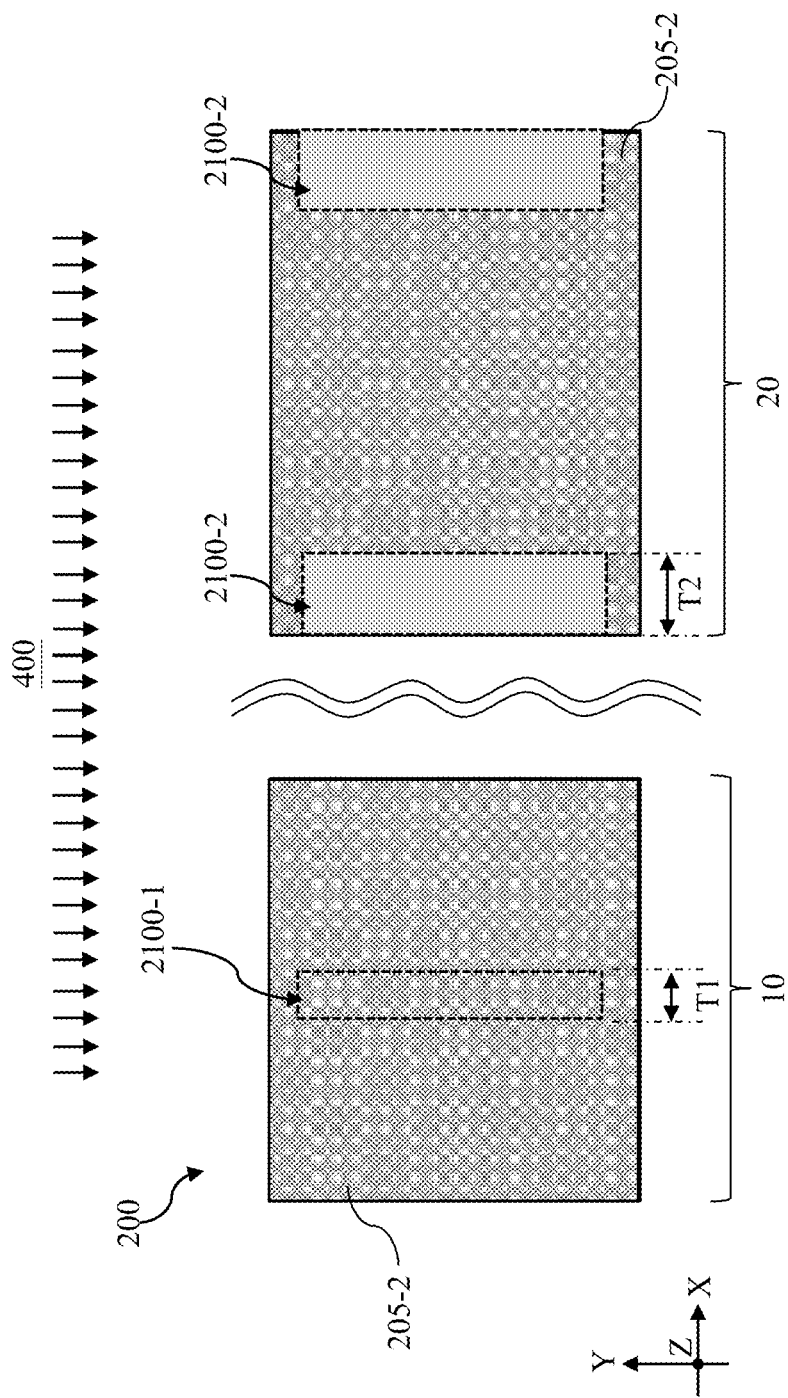

Referring to FIGS. 1 and 4, method 100 includes a block 106 where a second fin cut trench 2100-2 in the second area 20 of the workpiece 200 is formed. To provide a planar surface for the operations at block 106, a second photoresist layer 205-2 is deposited over the workpiece 200, including over the plurality of fin structures 204 and the first fin cut trench 2100-1 in the first area 10. In these embodiments, the second photoresist layer 205-2 is polymeric and may be deposited using spin-on coating. The second photoresist layer 205-2 may then be patterned using a second lithography process 400 to form a second photoresist pattern. In some implementations, the second lithography process 400 may include a second radiation source (not explicitly shown), such as a krypton fluoride excimer laser radiation source (KrF, wavelength about 248 nm), and may be free of immersion lithography. The patterned second photoresist layer 205-2 (i.e., second photoresist pattern) includes an opening that exposes the plurality of fin structures 204 in the second area 20. An anisotropic etch process may then be implemented to form the second fin cut trench 2100-2 in the second photoresist layer 205-2 and through the plurality of fin structures 204 in the second area 20. In some instances, the second fin cut trench 2100-2 includes a second trench width (T2) that is between about 100 nm and about 300 nm. In some embodiments, after the second fin cut trench 2100-2 is formed in the second area 20, the second photoresist layer 205-2 may be removed, for example, by ashing.

Because the second trench width (T2) is much greater than the first trench width (T1), methods of the present disclosure form them in two different process steps, such as in block 104 and in block 106 of method 100. If the first photoresist layer 205-1 is patterned to have a first opening for the first fin cut trench 2100-1 and a second opening for the second fin cut trench 2100-2. The first opening would have a width corresponding to the first trench width (T1) and the second opening would have a width corresponding to the second trench width (T2). Due to the width differences, etching of the plurality of fin structures 204 through the first opening and the second opening of the first photoresist layer 205-1 may take place at different rates. Compared to the etching through the wider second opening, etching through the narrower first opening may be much slower. Consequently, when the first fin cut trench 2100-1 and the second fin cut trench 2100-2 are etched simultaneously, once the first fin cut trench 2100-1 reaches the desirable depth, the second fin cut trench 2100-2 reaches a much greater depth. In some instances, when the first fin cut trench 2100-1 reaches the desirable depth, lateral etching may take place around the second fin cut trench 2100-2, resulting in process variations and a reduced yield.

Using different photolithography processes to form the first fin cut trench 2100-1 and the second fin cut trench 2100-2 helps reduce cost. Because the first trench width T1 (between about 10 nm and about 30 nm) is below the resolution limits of the second radiation source (e.g., a krypton fluoride excimer laser radiation source, with a wavelength about 248 nm), the first lithography process 300 for forming the first fin cut trench 2100-1 is costlier than the second lithography process 400 as it requires a more delicate mask and may involve immersion. On the contrary, the second trench width T2 is within the resolution limits of the second lithography process 400, which is more economical than the first lithography process 300. Therefore, although the first lithography process 300 may be perfectly suitable for forming the first fin cut trench 2100-1 and the second fin cut trench 2100-2, it may be an overkill and its use may unduly increase the cost. It is noted that the different photolithography processes at blocks 104 and 106 call for different photoresist layer as different photoresist layers are geared toward being used with different radiation sources. A person of ordinary skill in the art would appreciate that the operations at block 104 may take place before or after the operations at block 106. That is, according to the present disclosure, the first fin cut trench 2100-1 and the second fin cut trench 2100-2 are sequentially formed, regardless of the specific order, provided that they are not simultaneously formed.

Figure 5:
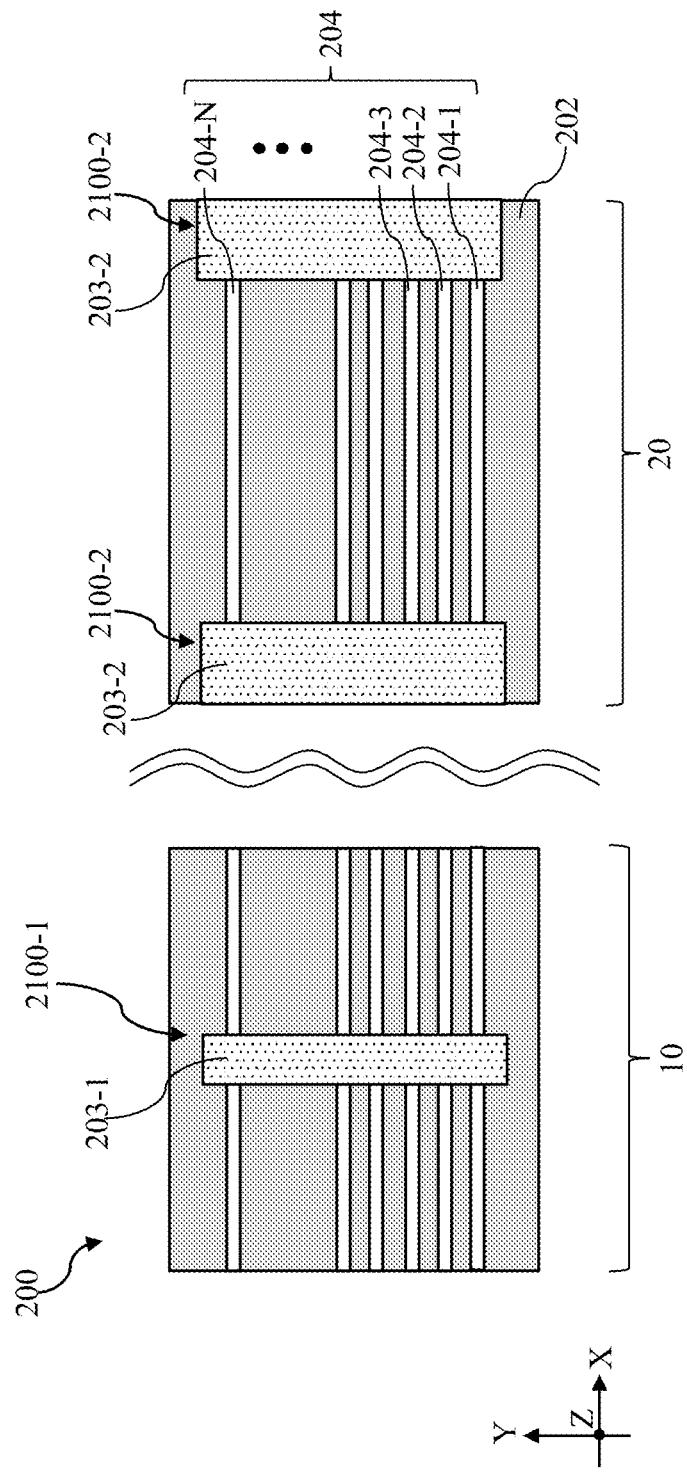

Referring to FIGS. 1 and 5, method 100 includes a block 108 where a first isolation feature 203-1 is formed in the first fin cut trench 2100-1. In some embodiments, the first isolation feature 203-1 may be formed of a dielectric material similar to that forming the isolation feature separating the plurality of fin structures 204. In some embodiments, the first isolation feature 203-1 may include silicon oxide, silicon nitride, silicon oxynitride, fluoride-doped silicate glass (FSG), a low-k dielectric material, and/or other suitable materials. In some implementations, the first isolation feature 203-1 may be deposited using spin-on coating, chemical vapor deposition (CVD), or a suitable deposition technique.

Referring to FIGS. 1 and 5, method 100 includes a block 110 where a second isolation feature 203-2 is formed in the second fin cut trench 2100-2. In some embodiments, the second isolation feature 203-2 may be formed of a dielectric material similar to that forming the isolation feature separating the plurality of fin structures 204. In some embodiments, the second isolation feature 203-2 may include silicon oxide, silicon nitride, silicon oxynitride, fluoride-doped silicate glass (FSG), a low-k dielectric material, and/or other suitable materials. In some implementations, the first isolation feature 203-1 may be deposited using spin-on coating, chemical vapor deposition (CVD), or a suitable deposition technique.

It is noted that operations at block 104, 106, 108, and 110 may take place in different possible order. In some embodiments, immediately after the formation of the first fin cut trench 2100-1 at block 104, operations at block 108 may be performed to form the first isolation feature 203-1 in the first area 10. Then the second photoresist layer 205-2 may be deposited over the workpiece 200, including over the first isolation feature 203-1 in the first area 10, in order to form the second fin cut trench 2100-2. Operations at block 110 are then performed to form the second isolation feature 203-2 in the second area 20. In some alternative embodiments, immediately after the formation of the second fin cut trench 2100-2 at block 106, operations at block 110 may be performed to form the second isolation feature 203-2 in the second area 20. Then the first photoresist layer 205-1 may be deposited over the workpiece 200, including over the second isolation feature 203-2 in the second area 20, in order to form the first fin cut trench 2100-1. Operations at block 108 are then performed to form the first isolation feature 203-1 in the first area 10. In some additional embodiments, operations at blocks 104 and 106 are sequentially formed to form the first fin cut trench 2100-1 in the first area 10 and the second fin cut trench 2100-2 in the second area 20. Thereafter, operations at blocks 108 and 110 are then simultaneously performed to simultaneously form the first isolation feature 203-1 in the first area 10 and the second isolation feature 203-2 in the second area 20. Other orders and combinations of the operations at blocks 104, 106, 108, and 110 are fully envisioned.

Referring to FIGS. 1, 6, 7, 8, and 9, method 100 includes a block 112 where a first dummy gate stack 206-1 and a second dummy gate stack 210-1 are formed in the first area 10 and a third dummy gate stack 206-2 and a fourth dummy gate stack 210-2 are formed in the second area 20. Structures in the first area 10 of the workpiece 200 are illustrated in a fragmentary top view in FIG. 6 and a fragmentary cross-sectional view in FIG. 7. Structures in the second area 20 of the workpiece 200 are illustrated in a fragmentary top view in FIG. 8 and a fragmentary cross-sectional view in FIG. 9.

Figure 6:
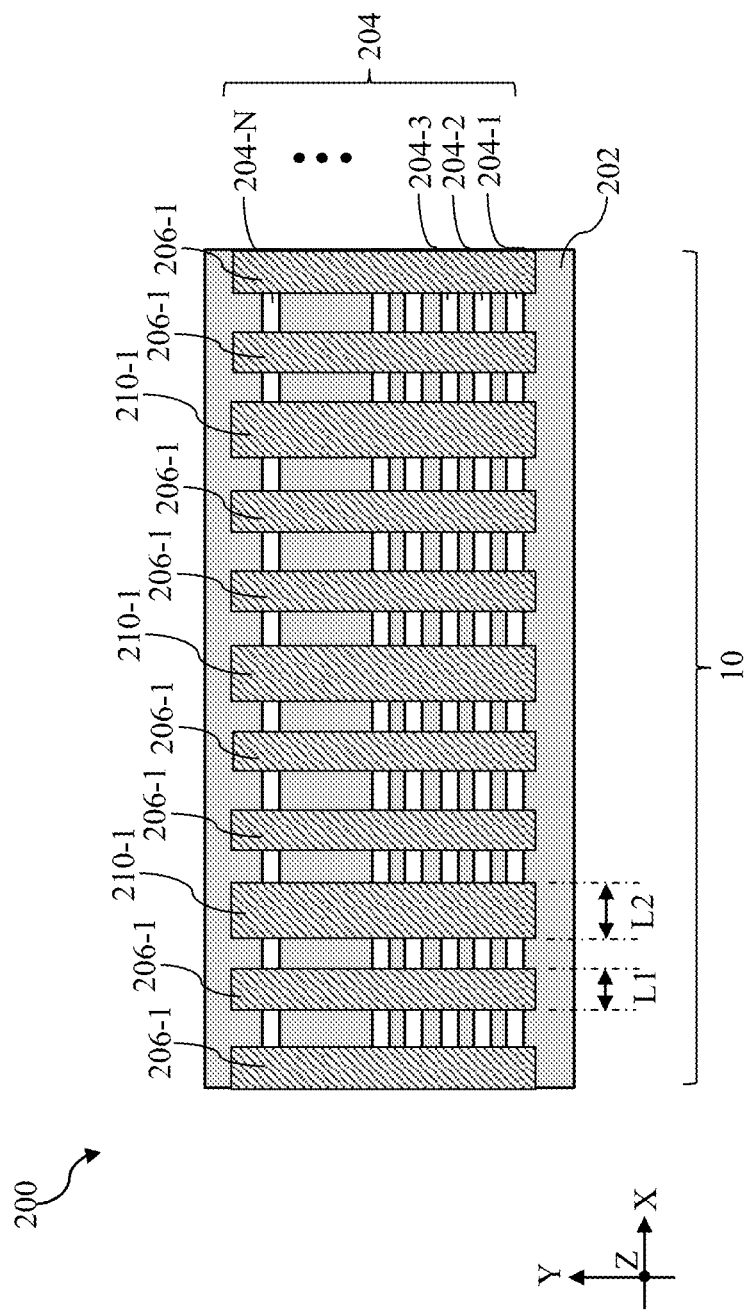
Figure 7:
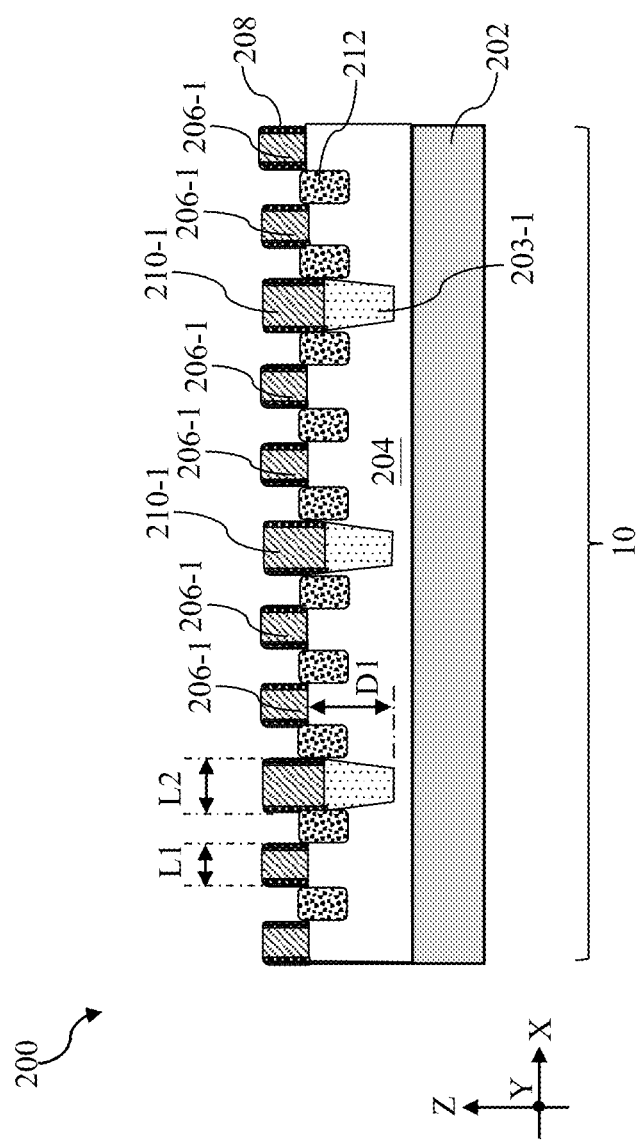
FIGS. 7 and 9-11 are fragmentary cross-sectional views of a workpiece undergoing various operations of the method in FIG. 1, according to various aspects of the present disclosure.

Reference is first made to FIGS. 6 and 7, the first dummy gate stack 206-1 is formed directly over channel regions of at least one of the plurality of fin structures 204 and the second dummy gate stack 210-1 is formed directly over the first isolation feature 203-1 in the first area 10. In some implementations illustrated in FIGS. 6 and 7, the first dummy gate stack 206-1 includes a first gate length L1 along the X direction and the second dummy gate stack 210-1 includes a second gate length L2 along the X direction. It is noted that the second gate length L2 of the second dummy gate stack 210-1 generally correspond to the first trench width T1. In some instances, the first gate length L1 may be between about 8 nm and about 33 nm and the second gate length L2 may be between about 10 nm and about 45 nm. To prevent leakage between adjacent transistors, the second gate length L2 is greater than the first gate length L1. In some examples, a ratio of the second gate length L2 to the first gate length L1 is between about 1.1 and about 1.4. Inversely, a ratio of the first gate length L1 to the second gate length L2 is between about 0.7 and about 0.9.

Figure 8:
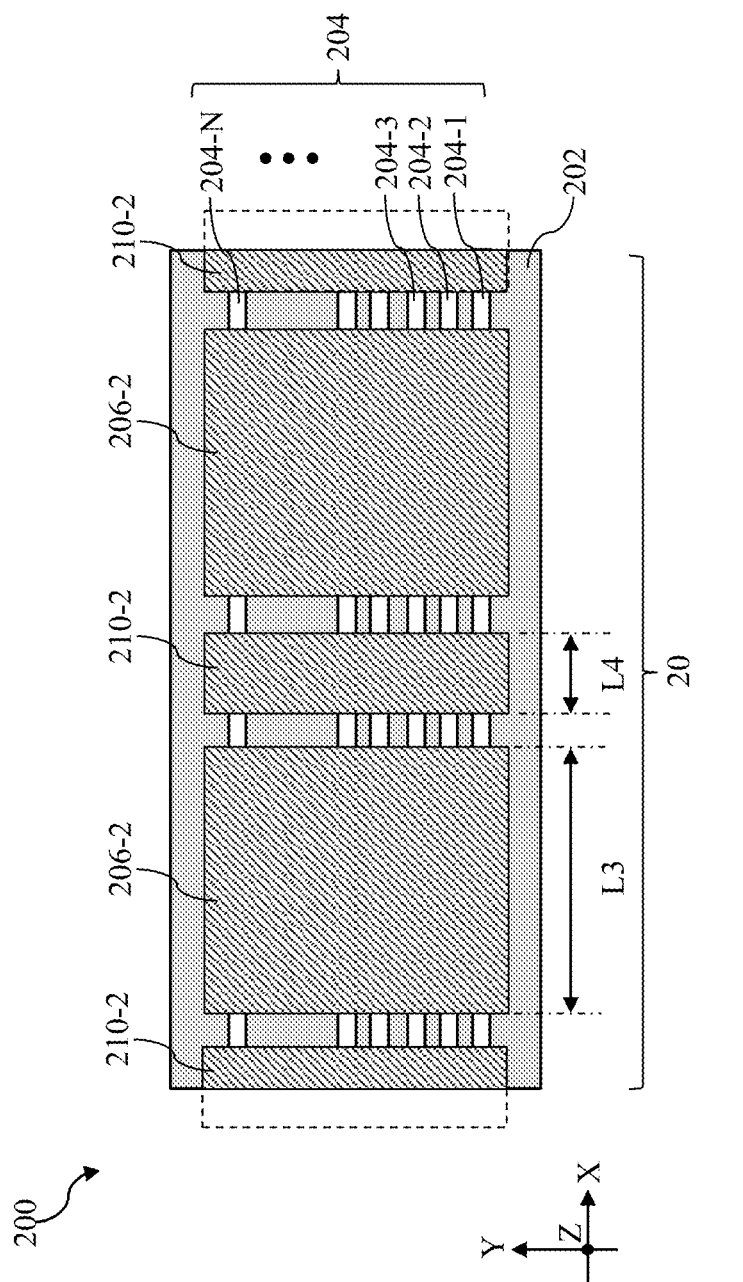
Figure 9:
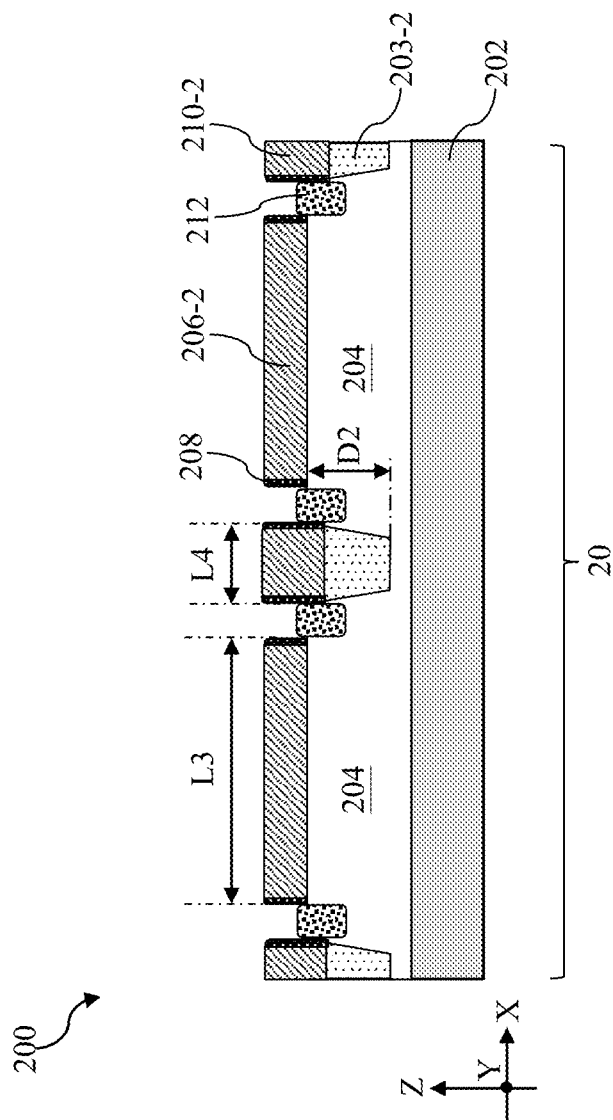

Referring to FIGS. 8 and 9, the third dummy gate stack 206-2 is formed directly over channel regions of at least one of the plurality of fin structures 204 and the fourth dummy gate stack 210-2 is formed directly over the second isolation feature 203-2 in the second area 20. In some implementations illustrated in FIGS. 8 and 9, the third dummy gate stack 206-2 includes a third gate length L3 along the X direction and the fourth dummy gate stack 210-2 includes a fourth gate length L4 along the X direction. It is noted that the fourth gate length L4 of the fourth dummy gate stack 210-2 generally correspond to the second trench width T2. The third gate length L3 is smaller than the fourth gate length L4. In some instances, the third gate length L3 may be between about 240 nm and about 6000 nm and the fourth gate length L4 may be between about 100 nm and about 300 nm. Because the second area 20 is a high voltage device area that require higher threshold voltages, higher saturation currents, and higher trans-conductance, the third gate length L3 is greater than the fourth gate length L4 even when the fourth gate length L4 and the underlying second isolation feature 203-2 serve to prevent leakage. In some examples, a ratio of the fourth gate length L4 to the third gate length L3 is between 0.02 and about 1. Inversely, a ratio of the third gate length L3 to the fourth gate length L4 is between about 1 and about 60. In some embodiments, a ratio of the fourth gate length L4 to the second gate length L2 is between about 3 and about 30 and a ratio of the third gate length L3 to the first gate length L1 is between about 15 and about 400.

Each of the first dummy gate stack 206-1, the second dummy gate stack 210-1, the third dummy gate stack 206-2, and the fourth dummy gate stack 210-2 may be formed of polysilicon and may be lined by a gate spacer 208. The gate spacer 208 is disposed along sidewalls of these dummy gate stacks (206-1, 206-2, 210-1, and 210-2). The gate spacer 208 may be a single layer or a multi-layer and may be formed of silicon nitride, hafnium silicide, aluminum oxynitride, hafnium oxide, lanthanum oxide, aluminum oxide, zirconium nitride, silicon carbide, zinc oxide, silicon oxycarbonitride, silicon, yttrium oxide, tantalum carbonitride, zirconium silicide, silicon carbonitride, zirconium aluminum oxide, titanium oxide, tantalum oxide, or zirconium oxide. Although not shown in FIGS. 6, 7, 8, and 9, these dummy gate stacks (206-1, 206-2, 210-1, and 210-2) may include a dummy gate dielectric layer disposed between the dummy gate stacks and the plurality of fin structures 204 and between the dummy gate stacks and the isolations features (203-1 and 203-2), as the case may be.

Depths of the first isolation feature 203-1 in the first area 10 and the second isolation feature 203-2 in the second area 20 illustrated in FIGS. 7 and 9, respectively. Referring to FIG. 7, a bottom surface of the first isolation feature 203-1 may reach a first depth (D1) from a top surface of the plurality of fin structures 204 along the Z direction. Similarly, as shown in FIG. 9, a bottom surface of the second isolation feature 203-2 may reach a second depth (D2) from the top surface of the plurality of fin structures 204 along the Z direction. As described above, due to the separate formation processes of the first fin cut trench 2100-1 in the first area 10 and the second fin cut trench 2100-2 in the second area 20, the first depth D1 and the second depth D2 may be substantially similar. In some instances, a ratio of the first depth D1 to the second depth D2 may be between about 0.9 and about 1.1.

As illustrated in FIGS. 6, 7, 8, and 9, after the formation of the dummy gate stacks (206-1, 206-2, 210-1, and 210-2), source/drain features 212 are formed in source/drain regions of the plurality of fin structures 204. Source/drain features 212 may be formed by any suitable techniques, such as etching processes followed by one or more epitaxy processes. In one example, using the dummy gate stacks (206-1, 206-2, 210-1, and 210-2) and the gate spacer 208 as an etch mask, one or more etching processes are performed to remove portions of the plurality of fin structures 204 in the source/drain regions to form recesses therein. A cleaning process may be performed to clean the recesses with a hydrofluoric acid (HF) solution or other suitable solution. Subsequently, one or more epitaxial growth processes are performed to grow epitaxial features in the recesses. Each of the source/drain features may be suitable for a p-type metal-oxide-semiconductor (PMOS) device (e.g., including a p-type epitaxial material) or alternatively, an n-type MOS (NMOS) device (e.g., including an n-type epitaxial material). The p-type epitaxial material may include one or more epitaxial layers of silicon germanium (SiGe), where the silicon germanium is doped with a p-type dopant such as boron, germanium, indium, and/or other p-type dopants. The n-type epitaxial material may include one or more epitaxial layers of silicon (Si) or silicon carbon (SiC), where the silicon or silicon carbon is doped with an n-type dopant such as arsenic, phosphorus, and/or other n-type dopant. In some implementations, each of the epitaxial growth processes may include different in-situ doping levels of suitable dopants. The epitaxial growth processes to form the source/drain features 212 may include vapor-phase epitaxy (VPE), ultra-high vacuum CVD (UHV-CVD), a cyclic deposition and etching (CDE) process, molecular beam epitaxy (MBE), and/or other suitable processes.

Figure 10:
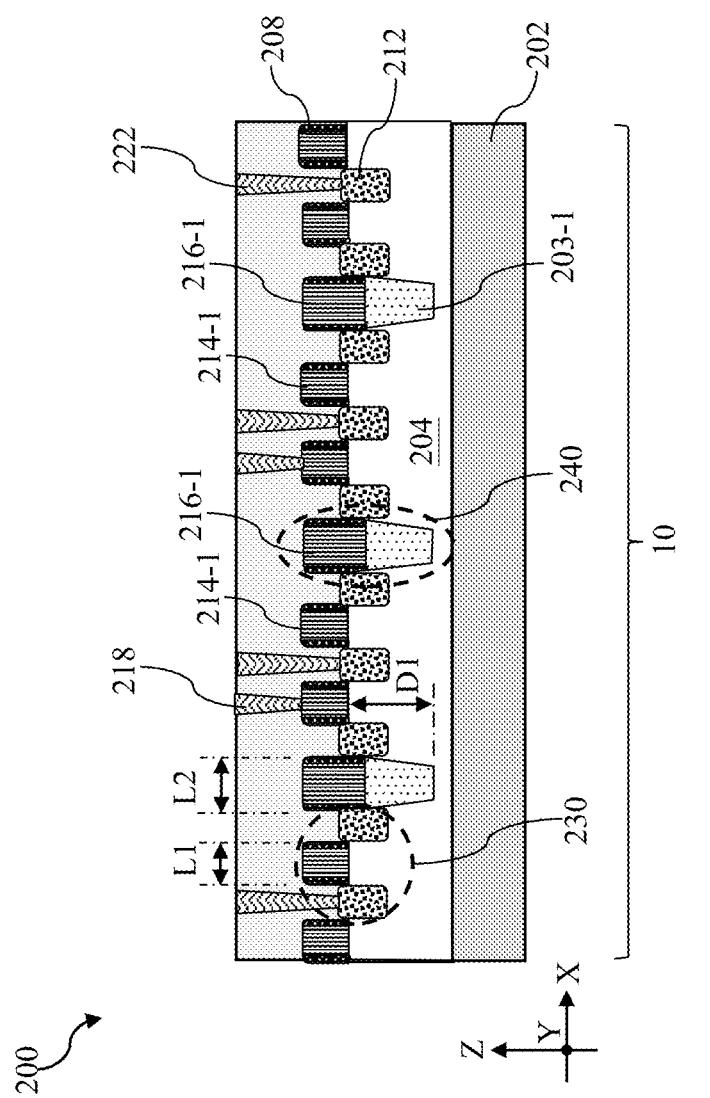
Figure 11:
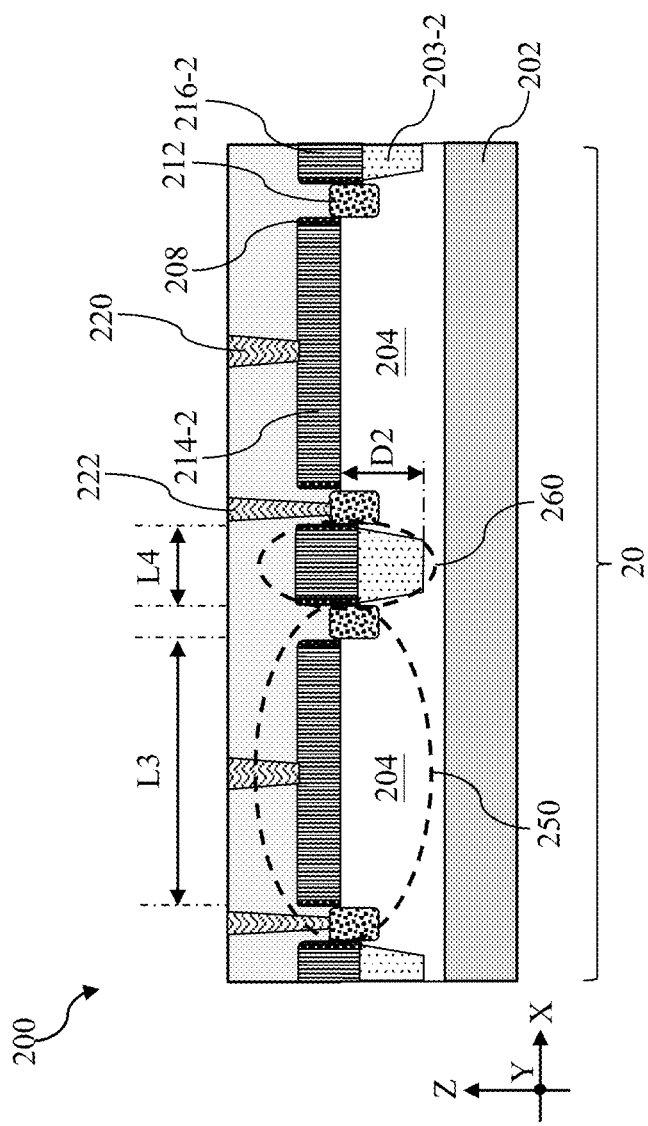

Referring to FIGS. 1, 10 and 11, method 100 includes a block 114 where the first dummy gate stack 206-1, the second dummy gate stack 210-1, the third dummy gate stack 206-2, and the fourth dummy gate stack 210-2 are replaced with a first gate structure 214-1, a first isolation gate structure 216-1, a second gate structure 214-2, and a second isolation gate structure 216-2. In some embodiments, a gate replacement process or a gate last process is adopted and the dummy gate stacks (206-1, 206-2, 210-1, and 210-2) are replaced with gate structures. Similar to the formation of the dummy gate stacks at block 112 above, the gate replacement process may be performed simultaneously to all of the first dummy gate stack 206-1, the second dummy gate stack 210-1, the third dummy gate stack 206-2, and the fourth dummy gate stack 210-2. Upon conclusion of the gate replacement, the first dummy gate stack 206-1 directly over at least one of the plurality of fin structures 204 in the first area 10 is replaced with a first gate structure 214-1 (or a first functional gate structure 214-1); the second dummy gate stack 210-1 directly over the first isolation feature 203-1 is replaced with a first isolation gate structure 216-1; the third dummy gate stack 206-2 directly over at least one of the plurality of fin structures 204 in the second area 20 is replaced with a second gate structure 214-2 (or a second functional gate structure 214-2); and the fourth dummy gate stack 210-2 directly over the second isolation feature 203-2 is replaced with a second isolation gate structure 216-2. The first isolation gate structure 216-1 and the second isolation gate structure 216-2 only serve to isolate device features and do not serve any circuit functions.

To replace the dummy gate stacks with gate structures, a contact etch stop layer (CESL) and an interlayer dielectric (ILD) layer (not shown) are formed over the workpiece 200, including over the source/drain features. A planarization process is then performed to the workpiece 200 to expose top surfaces of the dummy gate stacks (206-1, 206-2, 210-1, and 210-2). In instances where the dummy gate stacks (206-1, 206-2, 210-1, and 210-2) is formed of polysilicon, an etch process that is selective to polysilicon may be used to remove the dummy gate stacks (206-1, 206-2, 210-1, and 210-2) to expose the channel regions of the fin structures 204, without substantially damaging the gate spacer 208 and the ILD layer. In some embodiments, each of the first gate structure 214-1, the first isolation gate structure 216-1, the second gate structure 214-2, and the second isolation gate structure 216-2 includes a gate dielectric layer (not explicitly shown) and a gate electrode (not explicitly shown). The gate dielectric layer may include an interfacial layer on the channel regions of the fin structures 204 and one or more high-k dielectric layers (i.e., having a dielectric constant greater than that of silicon oxide, which is about 3.9) over the interfacial layer. In some implementations, the interfacial layer may include silicon oxide and the high-k dielectric layer may include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, the like, or combinations thereof. The interfacial layer functions to enhance adhesion of the high-k dielectric layers to the channel regions of the fin structures 204. The gate electrode may include at least one work function metal layer and a metal fill layer disposed thereover. Depending on the conductivity type of the semiconductor device 200, the work function metal layer may be a p-type or an n-type work function metal layer. Exemplary work function materials include TiN, TaN, Ru, Mo, Al, WN, $ZrSi_2$, $MoSi_2$, $TaSi_2$, $NiSi_2$, Ti, Ag, TaAl, TaAlC, TiAlN, TaC, TaCN, TaSiN, Mn, Zr, other suitable work function materials, or combinations thereof. The metal fill layer may include copper (Cu), tungsten (W), aluminum (Al), cobalt (Co), other suitable materials, or combinations thereof and may be deposited using physical vapor deposition (PVD), CVD, ALD, or other suitable processes.

As illustrated in FIG. 10, a first isolation gate structure 216-1 along with an underlying first isolation feature 203-1 may be collectively referred to as a first isolation structure 240. The semiconductor device 200 may include a plurality of first isolation structures 240 and each of them is disposed between two transistors 230 in the first area 10. Similarly, as shown in FIG. 11, a second isolation gate structure 216-2 along with an underlying second isolation feature 203-2 may be collectively referred to as a second isolation structure 260. The semiconductor device 200 may include a plurality of second isolation structures 260 and each of them is disposed between two transistors 250 in the second area 20. The second gate length (L2) defines the X-direction dimension of the first isolation structure 240. The fourth gate length (L4) defines the X-direction dimension of the second isolation structure 260. In embodiments where the semiconductor device 200 is an ADC, each of the transistors 230 is disposed in the digital area (i.e., first area 10) 10 and may have a threshold voltage between about 0.5 V and 1V and each of the transistors 250 is disposed in the analog area 20 (i.e., second area 20) and may have a threshold voltage between about 2.5V and 4.0V.

Referring to FIGS. 1, 10 and 11, method 100 includes a block 116 where further processes are performed. Such further processes may include deposition of a capping layer over the workpiece, formation of a further interlayer dielectric layer over the capping layer, formation of a first gate contact 218 in contact with the first gate structure 214-1, formation of a second gate contact 220 in contact with the second gate structure 214-2, recess of the source/drain features 212, formation of silicide features over the source/drain features 212, and formation of a first source/drain contact 222 in contact with the source/drain feature 212. These further processes form conductive features that interconnect various nodes and devices in the semiconductor device 200.

Although not intended to be limiting, one or more embodiments of the present disclosure provide benefits. For example, the present disclosure provides methods for forming core devices and high voltage devices over fin structures extending across a core device area and a high voltage device area. In order to form isolation structures of vastly different dimensions, methods of the present disclosure include separate operations and lithography processes for sequentially forming a first fin cut trench in a core device area and a second fin cut trench in a high voltage device area. To meet different device requirements for the core device area and the high voltage device area, width ratios of functional gate structures and isolation gate structures in these device areas are proposed for purposes of reducing leakage, meeting operating voltage requirements, reducing noises, and reducing gain and offset errors. Some embodiments of the present disclosure are suitable for ADCs in CMOS image sensors.

According to some embodiments, the present disclosure provides a method. The method includes providing a workpiece having a plurality of fin structures extending along a first direction over a first area and a second area of the workpiece, forming a first fin cut trench through the plurality of the fin structures in the first area, forming a second fin cut trench through the plurality of fin structures in the second area, depositing a dielectric material in the first fin cut trench and the second fin cut trench to form a first isolation feature and a second isolation feature, respectively, and forming a first isolation gate structure directly over the first isolation feature and a second isolation gate structure directly over the second isolation feature. The first fin cut trench includes a first width along the first direction and the second fin cut trench includes a second width along the first direction and a ratio of the second width to the first width is between 3 and 30.

In some embodiments, the first fin cut trench and the second fin cut trench extend lengthwise along a second direction perpendicular to the first direction. In some implementations, the method may further include forming a first gate structure over the plurality of fin structures in the first area and forming a second gate structure over the plurality of fin structures in the second area. In these implementations, the first gate structure includes a third width, the second gate structure includes a fourth width, and a ratio of the fourth width to the third width is between about 15 and about 400. In some instances, the first fin cut trench includes a first depth, the second fin cut trench includes a second depth, and the first depth is substantially equal to the second depth. In some embodiments, the forming of the first isolation gate structure and the second isolation gate structure includes forming a first dummy gate stack over the first isolation feature, forming a second dummy gate stack over the second isolation feature, replacing the first dummy gate stack with a first isolation gate structure, and replacing the second dummy gate stack with a second isolation gate structure. In some instances, the forming of the first fin cut trench includes depositing a material layer over the workpiece, depositing a first photoresist layer over the material layer, exposing the first photoresist layer using a first radiation source, developing the exposed first photoresist layer to form a first photoresist pattern, and etching the material layer and the plurality of fin structures in the first area using the first photoresist pattern as an etch mask. In some examples, the forming of the second fin cut trench includes depositing a second photoresist layer over the material layer, exposing the second photoresist layer using a second radiation source, developing the exposed second photoresist layer to form a second photoresist pattern, and etching the material layer and the plurality of fin structures in the second area using the second photoresist pattern as an etch mask. A wavelength of the first radiation source is smaller than a wavelength of the second radiation source. In some embodiments, a composition of the first photoresist layer is different from a composition of the second photoresist layer.

According to other embodiments, the present disclosure provides a semiconductor device. The semiconductor device includes a substrate including a first area and a second area, a plurality of fin structures extending along a direction over the first area and the second area of the substrate, a first transistor and a second transistor in the first area, wherein the first transistor includes a first gate structure disposed over at least one of the plurality of fin structures and the second transistor includes a second gate structure disposed over at least one of the plurality of fin structures, a first isolation structure disposed between the first transistor and the second transistor, a third transistor and a fourth transistor in the second area, wherein the third transistor includes a third gate structure disposed over the plurality of fin structures and the fourth transistor includes a fourth gate structure disposed over the plurality of fin structures, and a second isolation structure disposed between the third transistor and the fourth transistor. The first isolation structure includes a first width along the direction and the second isolation structure includes a second width along the direction and a ratio of the second width to the first width is between about 3 and about 30.

In some embodiments, the first isolation structure includes a first isolation feature extending a first depth into the plurality of fin structures and a first isolation gate structure disposed on the first isolation feature. The second isolation structure includes a second isolation feature extending a second depth into the plurality of fin structures and a second isolation gate structure disposed on the second isolation feature. In some implementations, the first depth is substantially identical to the second depth. In some instances, each of the first gate structure and the second gate structure includes a third width along the direction, each of the third gate structure and the fourth gate structure includes a fourth width along the direction, and a ratio of the fourth width to the third width is between about 15 and about 400. In some embodiments, a ratio of the fourth width to the second width is between about 1 and about 60. In some instances, the first transistor and the second transistor in the first area operate at a first voltage and the third transistor and the fourth transistor in the second area operate at a second voltage greater than the first voltage. In some examples, the first voltage is between about 0.8V and about 1V and the second voltage is between about 2.5V and about 3.3V.

According to still other embodiments, the present disclosure provides an analog-to-digital converter. The analog-to-digital converter includes a substrate including a digital area and an analog area, a plurality of fin structures extending along a direction over the digital area and the analog area of the substrate, a first transistor and a second transistor in the digital area, wherein the first transistor includes a first gate structure disposed over at least one of the plurality of fin structures and the second transistor includes a second gate structure disposed over at least one of the plurality of fin structures, a first isolation structure disposed between the first transistor and the second transistor, wherein the first isolation structure includes a first isolation feature extending a first depth into the plurality of fin structures and a first isolation gate structure disposed on the first isolation feature, a third transistor and a fourth transistor in the analog area, wherein the third transistor includes a third gate structure disposed over the plurality of fin structures and the fourth transistor includes a fourth gate structure disposed over the plurality of fin structures, and a second isolation structure disposed between the third transistor and the fourth transistor, wherein the second isolation structure includes a second isolation feature extending a second depth into the plurality of fin structures and a second isolation gate structure disposed on the second isolation feature.

In some embodiments, the first depth is substantially identical to the second depth. In some implementations, the first isolation structure includes a first width along the direction and the second isolation structure includes a second width along the direction and a ratio of the second width to the first width is between about 3 and about 30. In some instances, each of the first gate structure and the second gate structure includes a third width along the direction, each of the third gate structure and the fourth gate structure includes a fourth width along the direction, and a ratio of the fourth width to the third width is between about 15 and about 400. In some embodiments, a ratio of the fourth width to the second width is between about 1 and about 60.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method, comprising:
    forming a plurality of fin structures over a substrate, the plurality of fin structures extending lengthwise along a first direction over a first area and a second area of the substrate, the first direction being extending along a top surface of the substrate;
    forming a first fin cut trench through more than one of the plurality of the fin structures in the first area;
    forming a second fin cut trench through more than one of the plurality of fin structures in the second area;
    depositing a dielectric material in the first fin cut trench and the second fin cut trench to form a first isolation feature and a second isolation feature, respectively; and
    forming a first isolation gate structure directly over a top surface of the first isolation feature and a second isolation gate structure directly over a top surface of the second isolation feature,
    wherein the first fin cut trench includes a first width along the first direction and the second fin cut trench includes a second width along the first direction,
    wherein the forming of the first isolation gate structure and the second isolation gate structure comprises:
        forming a first dummy gate stack over the first isolation feature;
        forming a second dummy gate stack over the second isolation feature;
        replacing the first dummy gate stack with a first isolation gate structure; and
        replacing the second dummy gate stack with a second isolation gate structure wherein a ratio of the second width to the first width is between 3 and 30.

2. The method of claim 1,
    wherein the plurality of fin structures extend in parallel along the first direction and are spaced apart from one another along a second direction perpendicular to the first direction,
    wherein the first fin cut trench and the second fin cut trench extend lengthwise along the second direction.

3. The method of claim 1, further comprising:
forming a first gate structure over the plurality of fin structures in the first area; and
forming a second gate structure over the plurality of fin structures in the second area,
wherein the first gate structure includes a third width,
wherein the second gate structure includes a fourth width,
wherein a ratio of the fourth width to the third width is between about 15 and about 400.

4. The method of claim 1,
wherein the first fin cut trench includes a first depth,
wherein the second fin cut trench includes a second depth,
wherein the first depth is substantially equal to the second depth.

5. The method of claim 1, wherein the forming of the first fin cut trench comprises:
depositing a material layer over the substrate and the plurality of fin structures;
depositing a first photoresist layer over the material layer;
exposing the first photoresist layer using a first radiation source;
developing the exposed first photoresist layer to form a first photoresist pattern; and
etching the material layer and the plurality of fin structures in the first area using the first photoresist pattern as an etch mask.

6. The method of claim 5,
wherein the forming of the second fin cut trench comprises:
depositing a second photoresist layer over the material layer,
exposing the second photoresist layer using a second radiation source,
developing the exposed second photoresist layer to form a second photoresist pattern, and
etching the material layer and the plurality of fin structures in the second area using the second photoresist pattern as an etch mask,
wherein a wavelength of the first radiation source is smaller than a wavelength of the second radiation source.

7. The method of claim 6, wherein a composition of the first photoresist layer is different from a composition of the second photoresist layer.

8. The method of claim 6,
wherein the wavelength of the first radiation source is about 193 nm,
wherein the wavelength of the second radiation source is about 248 nm.

9. A method, comprising:
receiving a workpiece comprising a plurality of fin structures extending continuously along a first direction over a first area and a second area;
forming a first patterned photoresist layer over the workpiece;
etching the workpiece using the first patterned photoresist layer as an etch mask to form a first fin cut trench in the first area, the first fin cut trench extending lengthwise along a second direction perpendicular to the first direction and comprising a first trench width along the first direction;
forming a second patterned photoresist layer over the workpiece, including over the first fin cut trench;
etching the workpiece using the second patterned photoresist layer as an etch mask to form a second fin cut trench in the second area, the second fin cut trench extending lengthwise along the second direction and comprising a second trench width along the first direction;
forming a first isolation feature in the first fin cut trench and a second isolation feature in the second fin cut trench;
forming a first dummy gate stack directly over the first isolation feature and a second dummy gate stack over a first channel region of the plurality of fin structures in the first area;
forming a third dummy gate stack directly over the second isolation feature and a fourth dummy gate stack over a second channel region of the plurality of fin structures in the second area; and
replacing the first dummy gate stack, the second dummy gate stack, the third dummy gate stack, and the fourth dummy gate stack with a first gate structure, a first isolation gate structure, a second gate structure, and a second isolation gate structure, respectively,
wherein, along the first direction, the first dummy gate stack comprises a first width, the second dummy gate stack comprises a second width, the third dummy gate stack comprises a third width, and the fourth dummy gate stack comprises a fourth width,
wherein the fourth width is greater than the second width,
wherein a ratio of the second trench width to the first trench width is between 3 and 30.

10. The method of claim 9, wherein the third width is greater than the first width.

11. The method of claim 9, wherein the first width is greater than the second width.

12. The method of claim 9, wherein the fourth width is greater than the third width.

13. The method of claim 9,
wherein the first isolation feature comprises a first depth,
wherein the second isolation feature comprises a second depth,
wherein the first depth is substantially similar to the second depth.

14. The method of claim 9,
wherein the forming of the first patterned photoresist layer comprises use of a first radiation source,
wherein the forming of the second patterned photoresist layer comprises use of a second radiation source,
wherein a first wavelength of the first radiation source is smaller than a second wavelength of the second radiation source.

15. A method, comprising:
receiving a workpiece comprising a plurality of fin structures extending continuously along a first direction over a first area and a second area;
forming a first patterned photoresist layer over the workpiece;
etching the workpiece using the first patterned photoresist layer as an etch mask to form a first fin cut trench in the first area, the first fin cut trench extending lengthwise along a second direction perpendicular to the first direction;
forming a second patterned photoresist layer over the workpiece;
etching the workpiece using the second patterned photoresist layer as an etch mask to form a second fin cut trench in the second area, the second fin cut trench extending lengthwise along the second direction;
forming a first isolation feature in the first fin cut trench and a second isolation feature in the second fin cut trench;

forming a first dummy gate stack directly over the first isolation feature and a second dummy gate stack over a first channel region of the plurality of fin structures in the first area;

forming a third dummy gate stack directly over the second isolation feature and a fourth dummy gate stack over a second channel region of the plurality of fin structures in the second area; and replacing the first dummy gate stack, the second dummy gate stack, the third dummy gate stack, and the fourth dummy gate stack with a first gate structure, a first isolation gate structure, a second gate structure, and a second isolation gate structure, respectively, wherein the first fin cut trench comprises a first width along the first direction, wherein the second fin cut trench comprises a second width along the first direction, wherein a ratio of the second width to the first width is between 3 and 30.

16. The method of claim 15, wherein the first dummy gate stack comprises a first gate length along the first direction, wherein the second dummy gate stack comprises a second gate length along the first direction, wherein the first gate length corresponds to the first width, wherein the second gate length corresponds to the second width.

17. The method of claim 15, wherein the first width is between about 10 nm and about 35 nm, wherein the second width is between about 100 nm and about 300 nm.

18. The method of claim 15, wherein a composition of the first patterned photoresist layer is different from a composition of the second patterned photoresist layer.

19. The method of claim 15, wherein the forming of the first patterned photoresist layer comprises use of a first radiation source, wherein the forming of the second patterned photoresist layer comprises use of a second radiation source, wherein a first wavelength of the first radiation source is smaller than a second wavelength of the second radiation source.

20. The method of claim 19, wherein the first wavelength is about 193 nm and the second wavelength is about 248 nm.

* * * * *